(12) United States Patent
Tan et al.

(10) Patent No.: US 11,282,906 B2
(45) Date of Patent: Mar. 22, 2022

(54) ELECTRONIC DEVICE WITH BANK STRUCTURES

(71) Applicant: Merck Patent GmbH, Darmstadt (DE)

(72) Inventors: Li Wei Tan, Eastleigh (GB); Peter Levermore, Darmstadt (DE); Daniel Walker, Southampton (GB)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 16/325,550

(22) PCT Filed: Aug. 14, 2017

(86) PCT No.: PCT/EP2017/070562
§ 371 (c)(1),
(2) Date: Feb. 14, 2019

(87) PCT Pub. No.: WO2018/033510
PCT Pub. Date: Feb. 22, 2018

(65) Prior Publication Data
US 2019/0181203 A1 Jun. 13, 2019

(30) Foreign Application Priority Data

Aug. 17, 2016 (EP) ..................... 16184496

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3283* (2013.01); *H01L 51/5209* (2013.01); *H01L 51/5225* (2013.01); *H01L 51/56* (2013.01)

(58) Field of Classification Search
CPC ............. H01L 27/3246; H01L 27/3283; H01L 51/5209; H01L 51/5225; H01L 51/56
See application file for complete search history.

(56) References Cited

U.S. PATENT DOCUMENTS 6,388,377 B1  5/2002  Kobayashi et al.
7,365,367 B2  4/2008  Han et al.
(Continued)

FOREIGN PATENT DOCUMENTS

CN   104245783 A   12/2014
CN   104882468 A   9/2015
(Continued)

OTHER PUBLICATIONS

International Search Report for PCT/EP2017/070562 dated Feb. 19, 2018.
(Continued)

*Primary Examiner* — Lex H Malsawma
(74) *Attorney, Agent, or Firm* — Faegre Drinker Biddle & Reath LLP

(57) ABSTRACT

Electronic device and associated methods with multiple well areas located on a common substrate, where each well area is defined by at least three bank structures that form the side walls of the well area. Within each well area, there are at least two electrode segments where the electrode segments are separated laterally by at least one insulating bank where the insulating bank(s) are thicker than the electrode segments. There is at least one charge transporting layer completely filling the well area in direct contact and overlying both the electrode segments and the insulating bank(s). The well areas are filled using solution methods such as inkjet. Such devices have improved uniformity across the active areas.

28 Claims, 23 Drawing Sheets

(56) References Cited

U.S. PATENT DOCUMENTS

| | | | |
|---|---|---|---|
| 7,781,963 B2 | 8/2010 | Yoshida et al. | |
| 7,842,947 B2 | 11/2010 | Nakatani et al. | |
| 8,217,573 B2 | 7/2012 | Yoshida et al. | |
| 8,628,986 B2 | 1/2014 | Amamiya et al. | |
| 10,109,690 B2 | 10/2018 | Hosono et al. | |
| 2001/0024083 A1* | 9/2001 | Yamazaki | H01L 27/3281 |
| | | | 313/483 |
| 2003/0017360 A1 | 1/2003 | Tai et al. | |
| 2003/0076572 A1* | 4/2003 | Kawase | G02B 5/201 |
| | | | 359/245 |
| 2004/0140759 A1* | 7/2004 | Park | H01L 27/3283 |
| | | | 313/504 |
| 2007/0002383 A1 | 1/2007 | Ohmiya et al. | |
| 2007/0190673 A1 | 8/2007 | Ko et al. | |
| 2009/0078941 A1 | 3/2009 | Tsai et al. | |
| 2009/0244134 A1* | 10/2009 | Shinohara | B41J 3/407 |
| | | | 347/10 |
| 2010/0090204 A1 | 4/2010 | Chuman et al. | |
| 2010/0258833 A1* | 10/2010 | Okumoto | H01L 51/5209 |
| | | | 257/98 |
| 2011/0198598 A1 | 8/2011 | Kim et al. | |
| 2013/0285026 A1 | 10/2013 | Miskiewicz et al. | |
| 2014/0147950 A1 | 5/2014 | Choi et al. | |
| 2015/0340413 A1* | 11/2015 | Lee | G09G 3/3291 |
| | | | 257/40 |
| 2016/0126301 A1 | 5/2016 | Lee et al. | |
| 2016/0365396 A1 | 12/2016 | Hou et al. | |

FOREIGN PATENT DOCUMENTS

| | | |
|---|---|---|
| EP | 1933393 A1 | 6/2008 |
| GB | 2458454 A | 9/2009 |
| GB | 2462845 A | 2/2010 |
| JP | 2008-234989 A | 10/2008 |
| JP | 2008243406 A | 10/2008 |
| KR | 10-2015-0109357 A | 10/2015 |
| KR | 10-2015-0133890 A | 12/2015 |
| WO | WO-03083960 A1 | 10/2003 |
| WO | WO-2007023272 A1 | 3/2007 |
| WO | WO-2008117395 A1 | 10/2008 |
| WO | WO-2009077738 A1 | 6/2009 |
| WO | WO-2015141176 A1 | 9/2015 |

OTHER PUBLICATIONS

Written Opinion of the International Searching Authority for PCT/EP2017/070562 dated Feb. 19, 2018.

International Preliminary Report on Patentability received for PCT Patent Application No. PCT/EP2017/070562, dated Feb. 28, 2019, 7 pages.

\* cited by examiner

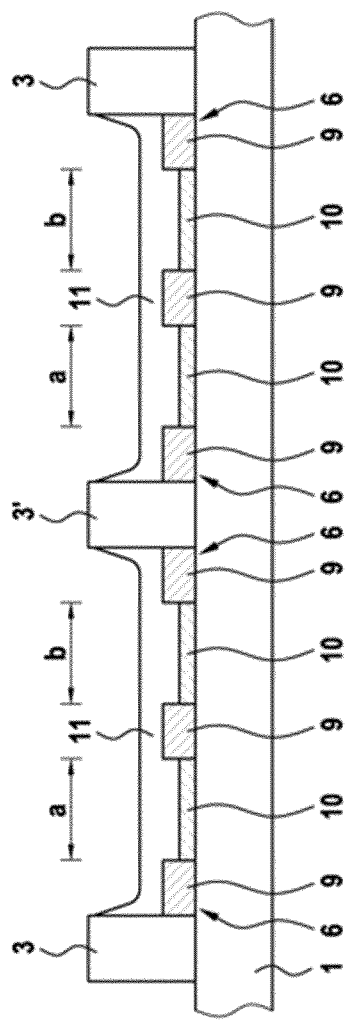
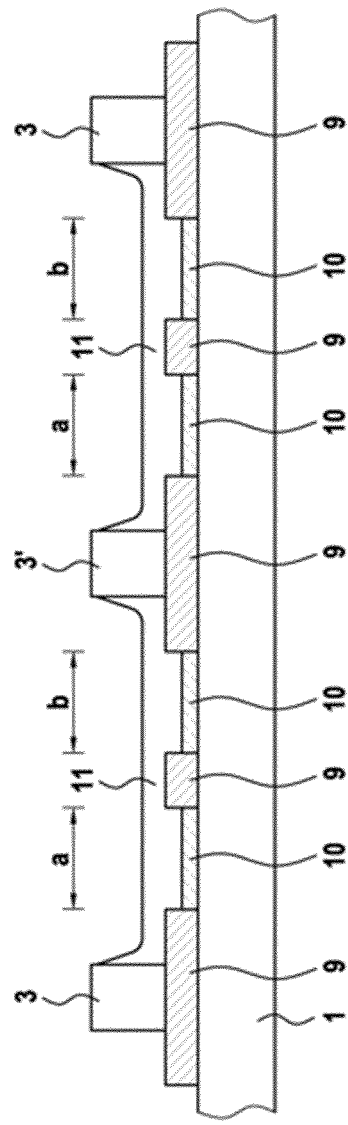
Fig. 4
Fig. 5

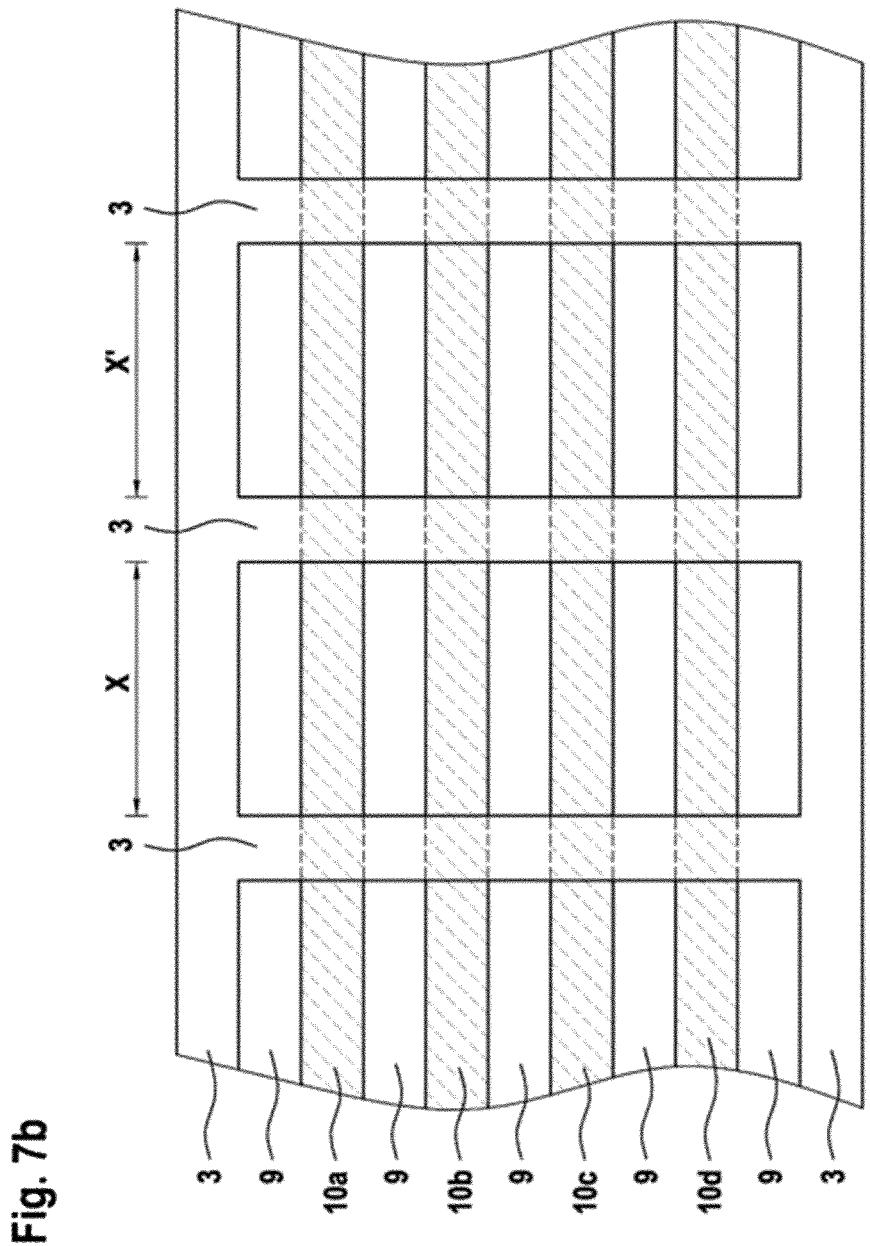

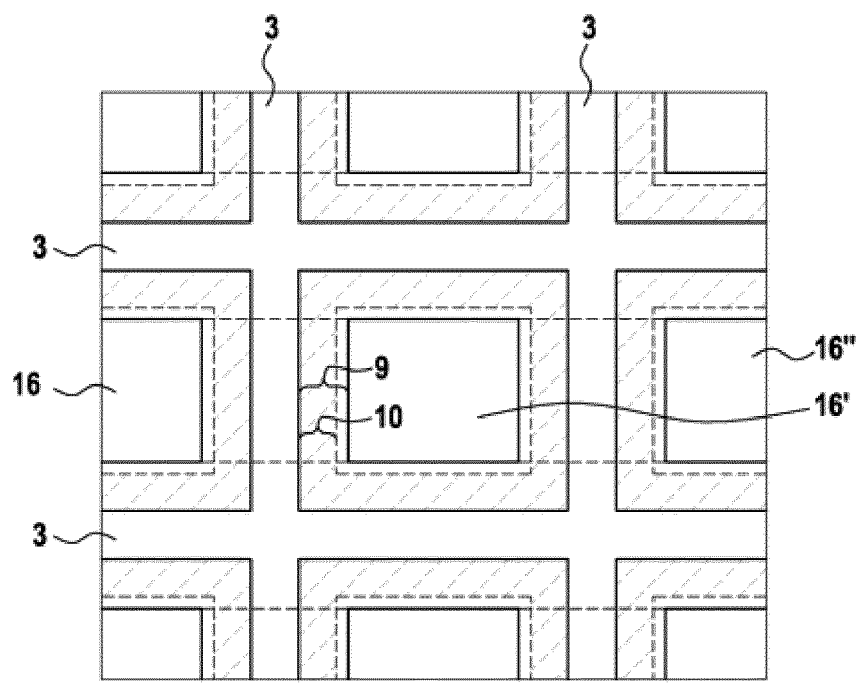

Cross-section 1   Cross-section 2

◸ green
◩ red
▧ blue

Cross-section 1

Cross-section 2

ELECTRONIC DEVICE WITH BANK STRUCTURES

CROSS-REFERENCE TO RELATED APPLICATIONS

This application is a national stage application (under 35 U.S.C. § 371) of PCT/EP2017/070562, filed Aug. 14, 2017, which claims benefit of European Application No. 16184496.4, filed Aug. 17, 2016, both of which are incorporated herein by reference in their entirety.

Embodiments in accordance with the present invention relate generally to the use of bank structures as a structure defining material in electronic devices, and more specifically to their use to define well areas within such devices and to organic electronic devices comprising such structures, to processes for preparing such structures and to electronic devices encompassing such structures.

BACKGROUND

It would desirable for cost and manufacturability to prepare electronic devices such as organic electronic (OE) devices, such as organic field effect transistors (OFETs) or organic light emitting diodes (OLEDs) by deposition of thin film elements (either active or passive materials) in solution on a specific area. Commonly used techniques such as shadow masking using high temperature vacuum deposition are expensive, wasteful of materials and require complicated machinery. One potential solution would be to provide a substrate comprising a patterned bank layer that defines wells into which the active components can be deposited in solution or in liquid form. The wells contain the solution while it is drying or solidifying, such that the active components remain in the areas of the substrate defined by the wells. The solutions can be introduced into the wells using ink-jet as well as other techniques.

Bank structures, and methods of forming them, are known to be used for defining such confined places (wells) on a substrate. For example, US 2007/0023837 A1, WO 2008/117395 A1, EP 1933393 A1, GB 2,458,454 A, GB 2,462,845 A, US 2003/017360 A1, US 2007/190673 A1, WO 2007/023272 A1 and WO 2009/077738 A1 individually and collectively are representative disclosures of such known structures and methods.

Even if a patterned layer of well-defining bank material is provided, problems still exist in containing the solution within the well region. Generally, solutions of a desired material are deposited within the well and the solvent removed, leaving a film of the desired material within the well. However, since the thickness of the residual film is often critical in such devices but the solubility within an appropriate solvent is often limited, the amount of solution needed to be deposited within the cell may exceed the volume of the well and the solution could overspill into adjacent wells. One solution to this problem is to control the wettability of the top of the banks so that the contact angle is sufficiently high so that the well can be overfilled without spilling. This is often accomplished by using fluorinated materials in the banks. Another problem occurs after the solvent is removed where the residual material is not uniform in thickness across the entire well area. Commonly, the thickness of the residual material is thicker near the well-defining bank structure because of wetting effects. This leads to non-uniform emission across the well, which is very undesirable. Known solutions to this wetting problem include the use of materials or treatments (for example, the use of fluorinated materials) for the bank structures to provide improved wetting properties. Another known solution relies on particular bank structure designs. However, since the banks are typically created using photolithography which may not be totally compatible with the proposed designs, these solutions to this problem have limitations.

U.S. Pat. Nos. 7,781,963, 8,217,573, US 2014/0147950, U.S. Pat. No. 8,628,986, and JP 2008/243406 all describe the formation of OLEDs by formation of wells using lines of bank structures over an electrode, followed by filling the wells using an inkjet method. These references all disclose the use of wider insulating layers under the bank structures. The underlying insulating layer prevents the emissive layer from emitting light near the walls of the bank which is uneven due to wetting effects at the bank walls. However, this method reduces the aperture size of the pixels.

U.S. Pat. No. 6,388,377 and WO 2003/083960 describes the formation of passive-matrix OLEDs which are prepared by forming wells from rows of banks over and in an orthogonal direction to patterned rows of a conductive layer (ITO) on a substrate, and filling the wells with organic layers necessary for light-emission by inkjet, followed by a patterned second conductive electrode. US 2004/0140759 describes OLEDs with channels to be filled via an ink-jet method which are defined by bank structures where there are barriers at the end of the channels to prevent the ink from running out of the channel.

U.S. Pat. No. 7,365,367 describes OLEDs with longitudinal and transverse bank structures of insulating materials that define pixels. The longitudinal banks are greater in height than the transverse banks. U.S. Pat. No. 7,842,947 discloses OLEDs with first banks that define a linear region and second banks that define the pixel regions. The height of the first banks are higher than the heights of the second banks. WO 2015/141176 discloses OLEDs with pixels divided by banks and insulating layers (a secondary bank that is transverse to the first bank). The insulation layers are arranged between and over first electrodes with (optionally) a hole injection layer adjacent in a first direction, and the banks are arranged between first electrodes adjacent in a second direction. In areas of intersection with the insulation layers, the banks extend over the insulation layer in the first direction. In all of these three references, the secondary banks/insulating layers lie over both the electrode and, if present, a hole-injection layer. However, since the insulating layer must be patterned (generally by a photolithographic process), the electrode and/or the hole injection layer can be damaged if present during the photolithographic process.

Thus, there is a need to provide electronic devices, particularly organic electroluminescent devices (OLEDs), with well areas that are defined by bank structures that have uniform active areas within the well, without reducing the size of the light-emitting areas and without having to deposit a patternable layer over sensitive underlying layers.

It has been found that the uniformity of the active layers can be improved by having a well area (defined by banks) subdivided into separate active areas. Within the well, there are at least two electrode segments located in the well area, the electrode segments being separated laterally by at least one insulating bank. Thus, each well area will have at least two separate active areas which correspond to the electrode segments. It is important that the thickness of the insulating bank be greater than the thickness of the electrode segment in order to prevent short circuits between adjacent electrode segments and to control flow of active layers during ink-jet deposition. Additionally, the use of insulating layers to separate and define the active areas by a manufacture process of depositing the electrode layer over a pre-patterned insulating layer (generally deposited on top of the substrate using photolithography) is simpler and easier to control than first forming the electrode segment (by masking or etching) and then forming the insulating layer (which may damage the electrode). The insulating banks are thicker than the electrode segments and do not fully overlie the electrode segments. Overlying both the electrode segments and insulating layers are at least one active layer, particularly a charge-transporting layer, that extends across the entire well area.

In this way, the well size can be made larger (thus reducing the % of lost emission adjacent to the bank structures that define the well) without reducing the total amount of light emission since the active subdivisions are not defined by the bank structures, but by the exposed surface of the multiple electrode segments within the well. Because there are no banks containing the individual active areas and no subsequent wetting effects, the active area has a uniform thickness across the electrode segment surface. The electrode segments/active areas can be sized appropriately so that the total active area within the cell is maintained. Correlation of the subdivided active area is not an issue since they can be individually controlled through the separate electrode segments as desired.

Thus it would be desirable to provide electronic devices with well-defining bank structures where the wells have multiple electrode segments separated by insulating layers and the well is filled entirely by at least one active layer that covers the electrode segments and dividing insulating layers. The well-defining banks being structures that are compatible with ink-jet printing and photolithography and which provide desirable solution-containing properties. Additionally, it would be desirable to provide electronic devices manufactured using such desirable structure defining materials and structure forming methods. Finally, there is a need to provide electronic devices with small active areas with uniform thickness.

SUMMARY

Embodiments in accordance with the present invention encompass an electronic device with multiple well areas located on a common substrate, where each well area is defined by at least three bank structures that form the side walls of the well area. Within each well area, there are at least two electrode segments where the electrode segments are separated laterally by at least one insulating bank where the insulating bank(s) are thicker than the electrode segments and where the insulating banks(s) do not fully overlie the electrode segments. There is at least one charge transporting layer completely filling the well area in direct contact and overlying both the electrode segments and the insulating bank(s).

In some embodiments, the electrode segments are anodes and the charge-transporting layer is a hole-transporting layer. In other embodiments, the electrode segments are cathodes and the charge-transporting layer is an electron-transporting layer.

In some embodiments, the top layer of the common substrate that is in direct contact with the electrode segments is a transparent metal oxide. The transparent metal oxide layer may be continuous over the entire active area or may be non-contiguous and separated into sections, each of which has multiple overlying electrode segments. In these embodiments, the transparent metal oxide layer can serve as part of the bottom electrode together with the electrode segments.

In some embodiments, the electrode segments are stripes (longer in length than width) that lie underneath multiple adjacent wells in one direction. In such embodiments, the counter electrodes lie over the active areas of adjacent wells in a direction perpendicular to the stripe electrodes and forms a passive matrix device. In other embodiments, each segment electrode is individually controlled and located entirely within a single well (the well having at least two independent electrode segments). In such embodiments, the counter electrode is typically common to all electrode segments and forms an active matrix device.

A method to make an electronic device by first providing a substrate with a pattern of electrode segments that are separated laterally by an insulating layer; the insulating layer being thicker than the electrode segment, forming a pattern of at least 3 bank structures to define a well area; the well area containing at least 2 different electrode segments separated by an insulating layer; and depositing a common charge-transporting layer that completely fills the well and covers both the electrode segments and the insulating layer(s). In one embodiment of the method, a pattern of insulating material is first formed on a substrate, followed by deposition of the electrode segment between the insulating materials. In another embodiment, a pattern of electrode segments is first formed on a substrate, followed by deposition of an insulating material between the electrode segments. The charge-transporting layers can be deposited by an ink-jet method.

Such electronic devices have the advantage of having active areas with uniform emission while minimizing loss of emission area due to wetting effects adjacent to the bank structures. Moreover, devices with these features can be readily manufacturable at low cost with high output using the methods described.

BRIEF DESCRIPTION OF THE DRAWINGS

Embodiments of the invention are described below with reference to the following drawings. Because the size of the individual components is very small, the drawings are not to scale.

FIG. 4 is a schematic representation of a cross-section of an embodiment where there are insulating layers adjacent to the bank structure.

FIG. 5 is a schematic representation of a cross-section of an embodiment where there are insulating layers under the bank structures.

FIG. 7b is a plane view of multiple well areas where there are 4 electrode segments that extend across multiple well areas in a single direction.

FIG. 12 (plane view) is a schematic representation of one embodiment of the invention with two electrode segments laterally separated by two different blocks of insulating layer, all over sections of a transparent metal oxide layer. In this embodiment, transparent metal oxide sections are in the form of a strip that extends across multiple well areas in one direction.

DETAILED DESCRIPTION

Figure 1A:
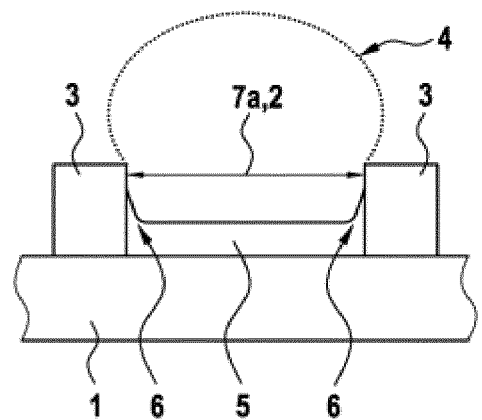
FIG. 1a is a schematic representation of a cross-section of a prior art substrate with well areas defined by bank structures.
Figure 1B:
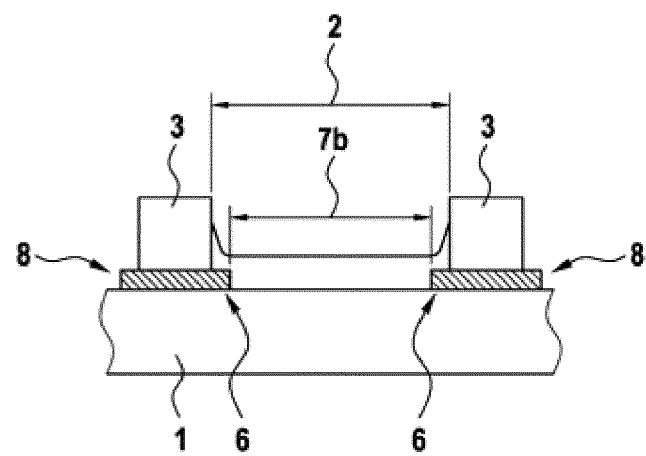
FIG. 1b is a cross-section of a prior art substrate where the bank structures are located on top of an insulating layer.

FIG. 1a shows a schematic representation of a typical problem occurring with deposition of active layers by a solution process such as ink-jet after removal of the solvent. A substrate 1 has a well area 2 defined by the side walls of bank structures 3. The well is typically overfilled with solution (dotted line 4) in order to provide a layer 5 after the solvent is removed. However, layer 5 is often thicker in the regions (6) adjacent to the bank structures 3 because of wetting effects. This leads to uneven emission over the entire active area 7a (the active areas correspond to the surface of the electrode segments that is in direct contact with overlying layers discounting any surface area covered by an insulating layer; in this case, the active area is equivalent to well area 2). One prior art solution is to use insulating layers 8 that are located under and are wider than the bank structures 3 as shown in FIG. 1b. Because of the insulating layer 8 (which prevents current flow between the electrodes), there is no emission in region 6 near the bank structures 3. However, active area 7b, although having uniform emission, is smaller than well area 2 (or the active area 7a in FIG. 1a). This leads to a loss in overall efficiency.

Figure 2A:
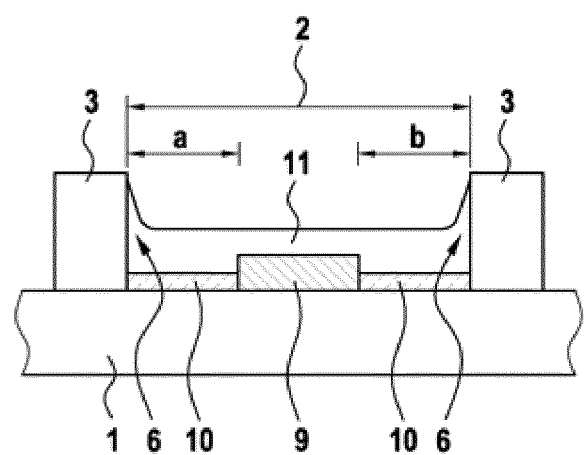
FIG. 2a is a schematic representation of a cross section of one embodiment of the invention with two electrode segments laterally separated by a thicker insulating layer that lie within the well area.
Figure 2B:
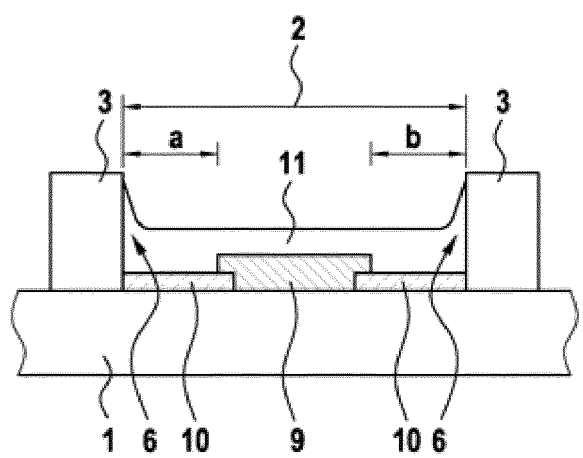
FIG. 2b is a schematic representation of a cross-section similar to FIG. 2a except that the insulating layer partially overlaps the electrode segments.

FIG. 2a shows a schematic cross-section of a well area of the one embodiment of the invention. On a substrate 1, there are bank structures 3 that define a well area 2. Within the well area 2, there are two electrode segments 10 separated laterally by an insulating layer 9. In this embodiment, the insulating layer 9 does not cover any part of the electrode segment 10. Insulating layer 9 is thicker (in terms of distance from the upper surface of the substrate) than the electrode segments 10. There is a charge transporting layer 11 that completely fills the well area 2 and covers both the electrode segment 10 and the insulating layer 9. FIG. 2b shows a similar embodiment where the insulating layer 9 partially overlaps the electrode segment 10. Note that active areas a and b will be more uniform than the active area 2 shown in FIG. 1a because there is only one thicker edge area 6 in each active area, as opposed to both edges being thicker.

Figure 3:
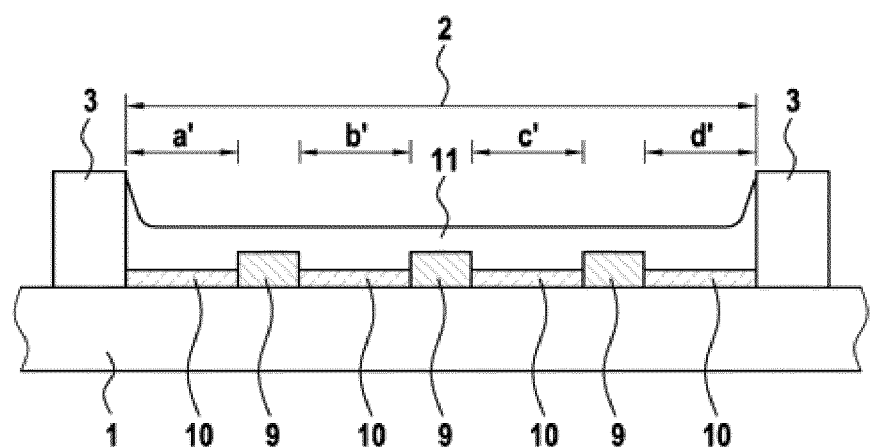
FIG. 3 is a schematic representation of a cross section of one embodiment of the invention with 4 electrode segments and 3 insulating layers within the well area.

FIG. 3 shows an embodiment similar to FIG. 2a but where there are many electrode segments 10 (in this illustration, four) separated by multiple insulating layers (in this illustration, three). The active areas are designated as a', b', c' and d') Note that active areas b' and c' will be completely uniform in thickness while active areas a' and d' will be improved (compared to prior art FIG. 1a) in uniformity of thickness (having only one thicker edge rather than two). Thus, the overall % of the active area that is thicker with in the well area is reduced and so, the uniformity of emission is improved. Note, that since each electrode segment within the same well area is separately controlled, there is no problem of correlation (where having several small light-emitting areas that are spatially correlated and not independent of each other, visibly appear as one large light-emitting area, which leads to a loss in resolution).

In FIGS. 2a, 2b and 3, the bank structures 3 are shown as being in contact with the substrate 1 and directly abutting the electrode segments 10. However, in some embodiments, the banks structures 3 may be laterally separated from the electrode segments 10 by an additional insulting layer 9. For example, FIG. 4 shows two adjacent well areas, separated by a bank structure 3', where there are insulating layers 9 on either side of the bank structure 3', which separate the bank structure 3' from the electrode segments 10 in addition to also separating the individual electrode segments 10. In this embodiment, both the bank structures and insulating layer are in contact with the substrate. While the insulating layer that separates the electrode segments must be thicker that the segments, the thickness of the insulating layers located adjacent to the bank structures is not critical and may be thicker (as shown), the same or thinner than the electrode segments. This is because the electrode segments are also separated by the bank structures. FIG. 5 shows a similar arrangement to FIG. 4, except that the bank structures 3 are located on top of the insulating layer 9 instead of being in contact with the substrate 1. In this example, the bank structure is not in direct contact with the substrate. While the insulating layer that separates the electrode segments must be thicker that the segments, the thickness of the insulating layers located beneath the bank structures is not critical and may be thicker (as shown), the same or thinner than the electrode segments. For the embodiments shown in FIGS. 4 and 5, uniformity is further improved since the presence of the insulating layers 9 in the area 6 near the bank structures 3 prevent emission where the active layer is thicker because of the wetting problem.

Figure 6:
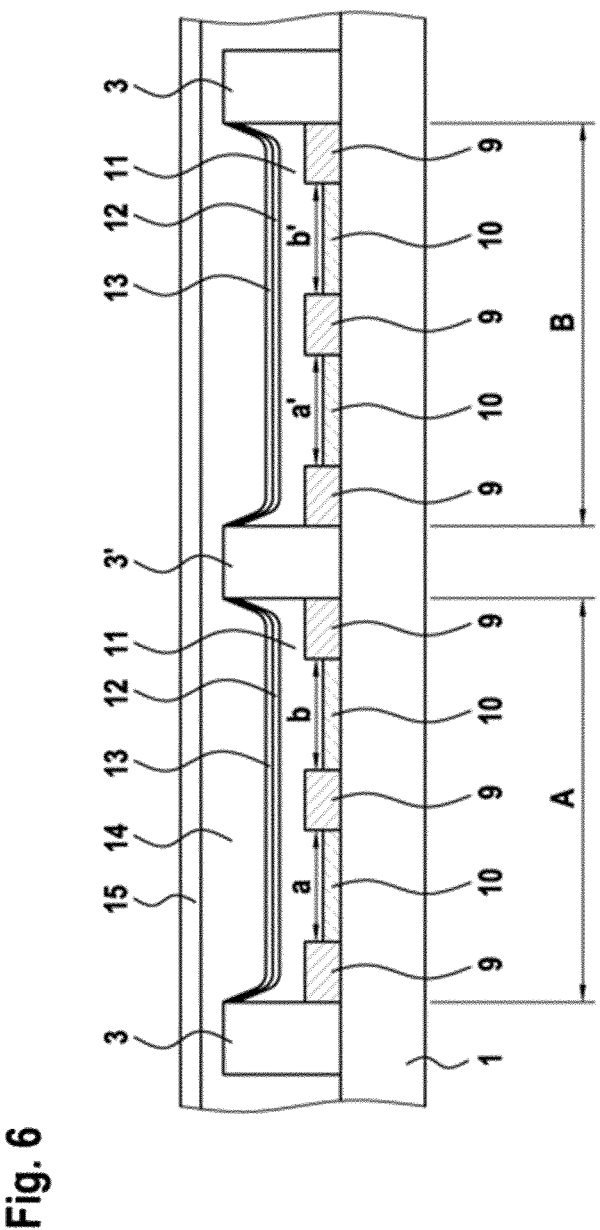
FIG. 6 is a schematic representation of a cross-section of a complete bottom emitting OLED according to the invention.

FIG. 6 shows a schematic illustration for one embodiment of a complete electronic device (a bottom emitting OLED) according to the invention. In this example, the substrate 1 is transparent and the electrode segments 10 are anode segments. Similar to FIG. 4, there is a substrate 1 on which there are bank structures 3 and 3' that define two well areas, A and B. Each well area contains multiple electrode segments separated by insulating layers where there are electrode segments 10 separately by insulating layers 9 to create active areas a, a', b, and b'. Filling the complete well areas (A and B) and covering the anode segments and insulating layers is a hole transporting layer 11. Overlying the hole transporting layer 11 are a light emitting layer 12 and an electron-transporting layer 13. Overlying these organic layers is a top metallic cathode 14. An encapsulation layer or cap 15 protects the entire device from moisture or oxygen.

The aforementioned organic electronic device is any electronic device which operates by having an active layer located between two oppositely charged electrodes; for example, a top gate or bottom gate Organic Field Effect Transistor (OFET), including Organic Thin Film Transistors (OTFTs), an Organic Light Emitting Diode (OLED) or an Organic Photovoltaic (OPV) device. Embodiments of the present invention are also inclusive of a product or an assembly comprising an organic electronic device as described above and below. Such product or assembly being an Integrated Circuit (IC), a Flat Panel Display (FPD), a backplane of an FPD, a backlight of an FPD, an electrowetting device, an electrophotographic device, an electrophoretic device, an electrophotographic recording device, an organic memory device, a sensor, a biosensor or a biochip. The invention further relates to a process of preparing an organic electronic device, like a top gate OFET or bottom gate OFET, comprising one or more bank structures as described hereinafter. As used herein, the term Organic Field Effect Transistors (OFET) will be understood to be inclusive of the subclass of such devices known as Organic Thin Film Transistors (OTFTs). Preferred applications are OLEDs.

The electronic devices of the invention are based on having at least one active or functional layer located between two electrically conductive layers (electrodes) of opposite charge. As used herein, an "active" or "functional" (terms that can be used interchangeably) layer is one composed of materials that whenever a current or a charge is applied across the two conductive layers, the materials cause a desirable effect. For example, in an OTFT, an applied charge across the conductive layers causes the active layer to change its conductive properties, thereby serving as an electrical switch. For an OLED, application of current between the conductive layers will cause light emission. It should be understood that an "active layer" may include any number of layers that are necessary to provide the desired effect. The "active area" of the electronic device are those areas which are energized by the electrically conductive layers and produce the desired effect. For example, the "active area" of an OLED would correspond to the area of the light-emitting pixel. In embodiments where there are insulating layers adjacent to the bank structures or insulating layers extending under and wider than an overlying bank structure, the active area will be smaller in area than the well area. In general, the shape of the active areas of the device is determined by both the shape of the exposed underlying electrode and any insulating layers or bank structures that surround the unexposed electrode. There are multiple active areas within a single well area, each of which can independently be the same shape as the well area (although smaller) or different in shape from the well area.

Appropriate active layer(s) and material(s) therein can be selected from standard materials, and can be manufactured and applied to the electronic device by standard methods. For example, an organic thin-film transistor (OTFT) has an active layer is an organic semiconducting or charge-carrying material; an electrowetting (EW) device has an active layer containing a colored liquid; an organic photovoltaic device (OPV) has an active layer containing a photoactive material; an electroluminescent (EL) device has an active layer containing a material that emits light; and an electrophoretic (EP) device has an active layer containing charged pigment particles dispersed in a liquid. Suitable materials and manufacturing methods for these devices, their components and layers are known to a person skilled in the art and are described in the literature.

The formation of the active layer(s) is accomplished by introducing the appropriate materials in a liquid form or as a solution in a solvent into the well areas defined by the bank structures. The method for applying the materials for the active layer(s) is not critical and may be carried out using a technique such as ink-jet, dispenser, nozzle coating, intaglio printing, letterpress printing or the like. Ink-jet methods are preferred. When the liquid containing the active material is applied with the dispenser, liquid discharge from the dispenser is preferably controlled by suck-back operation or the like at the beginning and the end of the application. When the materials are in liquid form without solvent, they can be solidified into the active layer by appropriate treatment. When the materials are in solution, the active layer is formed by removing the solvent by drying. Equipment, conditions and techniques for these processes are known to a person skilled in the art and are described in the literature.

As used herein, the term "bank structure(s)" will be understood to mean a patterned structure, for example a patterned layer, that is provided on an underlying substrate and defines a specific structure, for example a well, on said substrate that can be filled by a functional or active material. The patterned structure comprises a structure defining bank material that is selected such that a surface energy contrast is created between said patterned structure and the substrate upon which it rests. Usually the substrate has a higher surface energy while the patterned structure has a lower surface energy. The bank structure is used to define more easily the active area of a solution-processed thin film of, for example, the semiconductor in an electronic device, by using the tendency of the liquid solution to move and stick to the area having higher surface energy, i.e., a conductive layer. By confining the liquid in a given area, a thin film can be formed as needed in the specific device application. This provides certain benefits, for example in OFETs the confined area of organic semiconductor improves the off-state current. In the case of OLEDs, there are multiple independently controlled electrode segments (each of which will define a separate light-emitting area) within each well are; however, all of these individual light-emitting areas within the same well area will have all the same active layers since the entire well area is completely filled with the same solution. Thus, in OLEDs, the well area will define pixels or lines, depending on the number and orientation of the bank structures, of the same color.

As used herein, the term "substrate' will be understood to mean that base on which the first conductive layer, well-defining bank structures, functional materials within the well and second conductive layer are located. Substrates generally consist of a solid support which can be rigid (for example, glass or thick metal) or flexible (for example, plastic or thin metal). The support may have multiple subbing layers which can be either uniform over the entire surface or patterned. Examples of uniform subbing layers include electrically conductive layers such as transparent metal oxide layers, insulating layers, separation layers, light-absorbing opaque layers, reflective layers, scattering layers, anti-halation layers, planarization layers, adhesion layers and the like. Examples of patterned subbing layers include light-shielding layers, insulating layers, metallization layers, adhesion layers and the like. For many types of electronic devices, there will be control elements located on the support either under or adjacent to the active areas of the device. These control elements (for example, TFT circuits) generally receive signals and power from circuitry located in other locations within the device and subsequentially supply and send signals and power to the active areas. These connections are through busses or lines of conductive metals located in the substrate.

As defined herein, the electrode segment 10 is an electrically conductive layer in contact with the substrate. It is patterned; that is, it is not uniform across the surface of the substrate but is broken up into individual sections according to a regular pattern. The electrode segments 10 will underlie the active layers of the device. The terms "electrode segment" and "bottom electrode" can be used interchangeably. In practice, each segment is connected to a control element that supplies signal and charge through an electrical bus or wiring layers (these are not shown in the Figures). It may supply negative charge (for example, as in a cathode) or positive charge (for example, as in an anode). There is a second counter-electrode (i.e. cathode 14 in FIG. 6), which can also be referred to as a "top electrode", which will overlie the active layers and the sections of the electrode segments. It may be patterned in register with a single electrode segment, in register with every electrode segment within a single well area, in register with multiple well areas along a single direction or extend uniformly over all the electrode segments. It will carry a charge that is opposite to the first conductive layer. The second electrode layer is generally applied by sputtering or other vaporization techniques since the underlying active layers are not generally compatible with photolithography. Patterning of the second electrode layer, when desired, generally requires the use of shadow masks or if solution soluble, by an inkjet process.

For OLEDs, one of the electrode layers should be transparent or nearly transparent (for example, be composed of a transparent metal oxide or a very thin layer of a metal) and the other reflective (for example, a thick layer of metal). For a bottom-emitting OLED, the first bottom conductive layer should be transparent and the second top conductive layer should be reflective. For a top-emitting OLED, the first bottom conductive layer should be reflective and the second top conductive layer should be transparent.

Suitable electrode materials and deposition methods are known to the person skilled in the art. Such electrode materials include, without limitation, inorganic or organic materials, or composites of the two. Exemplary electrode materials include polyaniline, polypyrrole, poly(3,4-ethylenedioxythiophene) (PEDOT) or doped conjugated polymers, further dispersions or pastes of graphite or particles of metal such as Au, Mg, Al, Ag, Cu, Al, Ni or their mixtures as well as sputter-coated or evaporated metals such as Al, Mg, Cu, Cr, Pt/Pd, Ag, Au, Mg, Ca, Li or mixtures or transparent metal oxides such as indium tin oxide (ITO), F-doped ITO, GZO (gallium doped zinc oxide) or AZO (aluminum doped zinc oxide). Organo-metallic precursors may also be used and deposited from a liquid phase.

For the electrode segments, in some embodiments, it is desirable that they be made of transparent metal oxides. ITO is particularly desirable. Alternatively, for other embodiments, the electrode segments can be conductive metals or alloys thereof. Molybdenum is particularly desirable. In some embodiments, it is desirable that the metal electrode segments be dark and opaque. In other embodiments, it is desirable that the metal electrode segments to be thin (20 μm or less) so they are at least partially transparent.

Figure 7A:
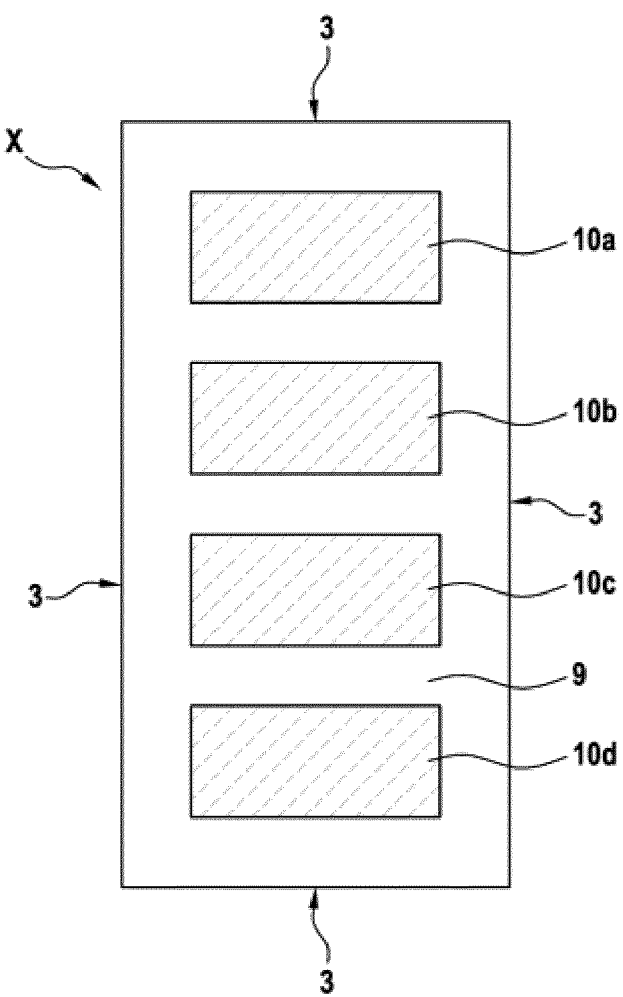
FIG. 7a is a plane view of a single well where there are 4 electrode segments within the well area with insulating layers adjacent to the bank structures as well laterally separating the electrode segments.

The electrode segments can have any shape and any thickness as known in the art. However, squares and rectangle shapes are preferred. The electrode segments may lie totally with a single well area or extend over multiple wells in a single direction. Each well area within the device may have a different number of electrode segments. An example is shown in FIG. 7a, where four electrode segments 10a, 10b, 10c and 10d lie totally within the well area X defined by the bank structures 3. The individual segments are separated by an insulating layer 9. In this example, the insulating layer also separates the electrode segments from the bank structures 3 as well (similar to the embodiment shown in FIG. 4). A similar example is shown in FIG. 7b, where the electrode segments 10a, 10b, 10c and 10d are stripes that extend across multiple well areas (X, X', etc.) along a single direction. Note that in this embodiment, the bank structures that are parallel to the direction of the electrode strips are separated from the electrode stripes but the bank structures that are orientated perpendicular to the direction of the electrode strips must be located over the electrode stripes. Since it is typically desirable to have the top of the bank structures all at the same height over the substrates as well as to have a uniform thickness of the bank structures themselves, it may be necessary to use a shim layer equal to the thickness of the electrode segments under the parallel bank structures.

The electrode segments, along with any associated wiring or electrical conductors, may be patterned into sections using known photolithographic techniques, deposited by printing or ink-jet processes, deposited by vacuum deposition methods using masks, deposited using uniform processes such as sputtering or spraying followed by removal of the unwanted material or any process that can be used to form the necessary pattern at the desired sizes and thicknesses.

Desirably, if the electrode segments are transparent anode segments, the thickness should be in the range of 1 to 500 nm for a metal oxide or 1 to 20 nm for thin metals. If the electrode segments are reflective metal, the thickness is desirably in the range of 50 to 500 nm. If the electronic device is an OLED, then the electrode segments are desirably transparent anodes and the OLED is a bottom-emitting device.

Figure 8A:
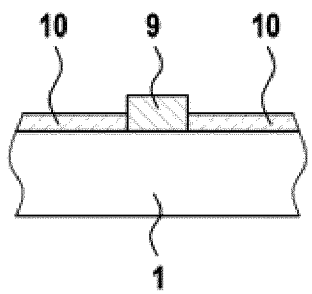
FIGS. 8a-8f are schematic representations of cross-sections illustrating alternative shapes for the top of the insulating layer.
Figure 8B:
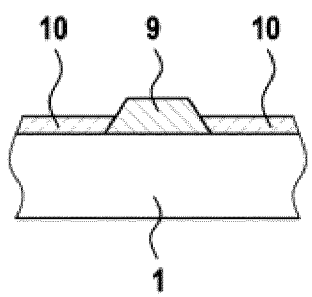
Figure 8C:
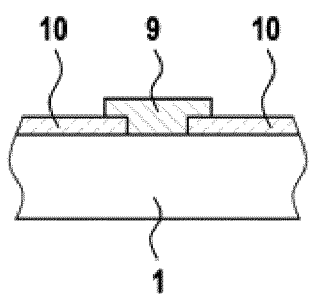
Figure 8D:
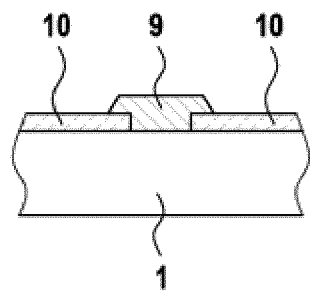
Figure 8E:
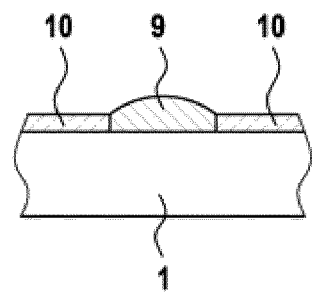
Figure 8F:
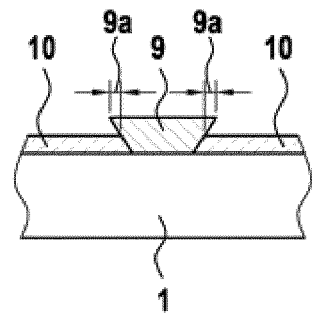

The electrode segments are laterally separated from each other by an insulating layer. By 'lateral' or 'laterally', it is meant in a direction parallel to the substrate. Both the electrode segments and insulating layer are located on the same substrate. By 'insulating', it is meant that the material of the layer is sufficiently non-conducting or electrically resistive that there is no effective electrical contact between the two electrode segments. The insulating layer is thicker than the electrode segments; that is, the insulating layer extends farther from the substrate than the electrode segments. Desirably, the thickness of the insulating layer is at least 30 nm greater than the electrode segments and desirably in the range of 50 to 150 nm. Having a thicker insulating layer than the electrode helps to prevent electrode contact between segments when the electrode segments and insulating layer are overcoated with the charge transporting layer. As shown in FIG. 8a for some embodiments, the insulating layer does not overlap the electrode segments. It should be noted that the interface between the electrode segments and the insulating layer need not be vertical or perpendicular to the substrate as shown in FIG. 8a, but can be set at an obtuse angle as in FIG. 8b. Alternatively, the insulating layer may partially overlap the electrode segment as illustrated in FIG. 8c. The angle of overlap may be vertical as shown in FIG. 8c or at an obtuse angle as shown in FIG. 8d. Alternatively, the top of the insulating layer need not be flat, but can be rounded as shown in FIG. 8e. It is also possible that the angle of interface can be an acute angle as shown in FIG. 8f. In this example, the overlapping part 9a of the insulating layer 9 need not be in direct contact with the upper surface of the electrode segment. However, the overlap 9a is still in position to disrupt current flow in this region. However, in these embodiments where the electrode segments serve as the only conductive electrode surface, the insulating layer should not totally overlap the electrode segment as it is necessary for at least some of the upper surface of the electrode segment to remain uncovered. Desirably, in these embodiments, the insulating layer should cover no more than 20% of the upper surface of the electrode segment; desirably no more than 10%.

The insulating layer may be formed of any material that is sufficiently non-conductive to prevent electric contact between adjacent electrode segments. It may be inorganic or organic. For example, non-conductive inorganic materials such as silicon oxide ($SiO_2$), silicon nitride ($Si_3N_4$) and silicon oxynitride (SiON) are suitable. Alternatively, the insulating layer may be formed form organic materials. Particular desirable organic materials are organic polymers, and preferably photoresist resins. The insulating layer may be formed from the same types of organic polymeric materials as the bank structures as described below.

Since it is located between the electrode segments, which are patterned, the insulating layer is also necessarily patterned. In some embodiments, the insulating layer is deposited after the formation of the electrode segments. In this case, an inorganic insulating layer may be deposited via an appropriate vapor deposition method using masks although other techniques are possible. Organic insulating materials may be patterned over the electrode segments using appropriate techniques such as photolithography, ink-jet, printing and the like as known. This allows for embodiments where the insulating layer partially overlaps the electrode segments. In other embodiments, the insulating layer is first patterned on a substrate using an appropriate process, followed by deposition of the electrode segments in the areas not covered by the insulating layer.

In some light-emitting embodiments, the top layer of the common substrate that lies directly under the electrode segments and in direct contact with them is a transparent metal oxide. In such embodiments, the substrate is transparent and the electrode segments are made of conductive metal, which may be thick and opaque or thin and transparent. This forms a bottom emitting device where the transparent metal oxide and overlying metal electrode segment together serve as a single electrode unit, typically an anode. Transparent metal oxide layers typically have insufficient lateral conductivity which can lead to uneven voltage charges across the device as a function of distance from the power leads to the transparent metal oxide layer. The presence of segments (for example, lines) of conductive metal electrode segments helps to distribute electrical charge across the entire surface of the transparent metal oxide. The gaps between the metal electrode segments allow for light transmission if the segments are opaque. The metal electrode segments located over a transparent metal oxide layer in this fashion are sometimes referred to as an auxiliary electrode.

Figure 9A:
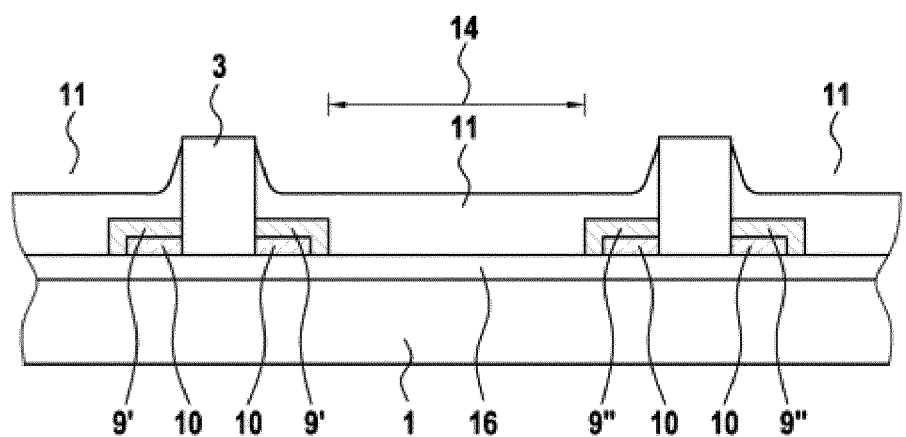
FIGS. 9a (cross section) and 9b (plane view) are schematic representations of one embodiment of the invention with two electrode segments laterally separated by two different blocks of insulating layer, all over a single layer of transparent metal oxide.
Figure 9B:
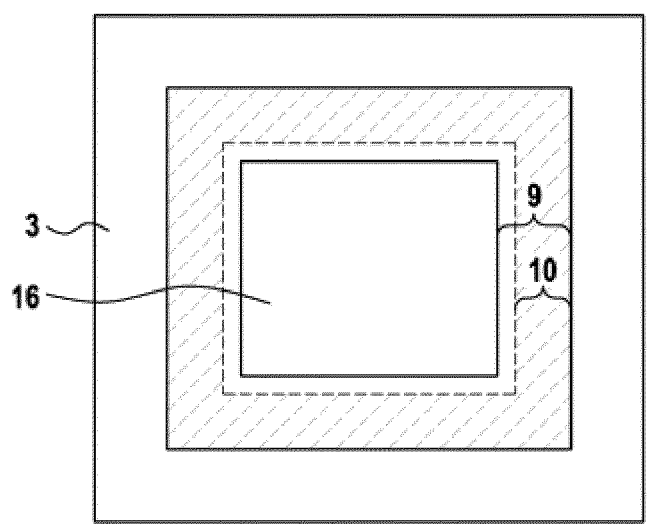

Note that in these embodiments using the electrode segments as an auxiliary electrode for a transparent metal oxide layer, the insulating layer does not fill the entire lateral space between the individual electrode segments and leaves a portion of the transparent metal oxide layer uncovered. However, in these embodiments, it is desirable that the insulating layer cover the entire top and sides of the electrode segment. This is preferred so that the individual electrode segments remain electrically independent and are not short circuited by the overlaying charge transporting layer. In these embodiments, the insulating layer will still be thicker than the electrode segment since it covers the sides of the electrode segment so that the top of the insulating layer is further from the substrate than the top of the electrode segment. Note that in such cases, that portion of the insulation layer that overlies the top of the electrode segment could be thicker, thinner or the same as the thickness of the electrode segment. Note that this is different from the embodiments where the electrode segments are the only electrode present and so cannot be fully covered by the insulating layer. The uncovered areas of the transparent metal oxide, which will be electrically conductive and serve as the bottom electrode, correspond to the active areas. This is shown in FIG. 9a, which is similar to FIG. 2a, where the top layer of the common substrate 1 is a single transparent metal oxide layer 16 that underlies the bank structures 3, the electrode segments 10 and insulating layers 9' and 9". Note that in this illustration as compared to FIG. 2a, the insulating layer 9 is divided into two parts 9' and 9" with a gap 14 between them but covers the upper surface of electrode segment 10. The gap 14, where the transparent metal layer is uncovered, corresponds to the active area of the completed device. The electrode segments serve as an auxiliary electrode to the transparent metal oxide anode. As before, the charge transporting layer 11 covers all structures between the bank structures 3. FIG. 9b is the plane view of the embodiment of FIG. 9a.

When using a transparent metal oxide layer/metal electrode segment combinations, the transparent metal oxide layer may be uniform and undivided over the entire active (light-emitting) area of the devices. That is, the transparent metal oxide layer extends under all well areas in the device and serves as a common electrode to all. In these embodiments, the counter electrode may also extend across over all well areas in common, may be divided into lines that extend across all wells in a single direction, or divided in individual segments that correspond to a single well area. When the counter electrode is divided, the individual sections should be individually controlled so that the resulting lines (the well areas in a single direction that share the counter electrode) or pixels (the individual well areas) can be separately powered as desired.

Figure 10A:
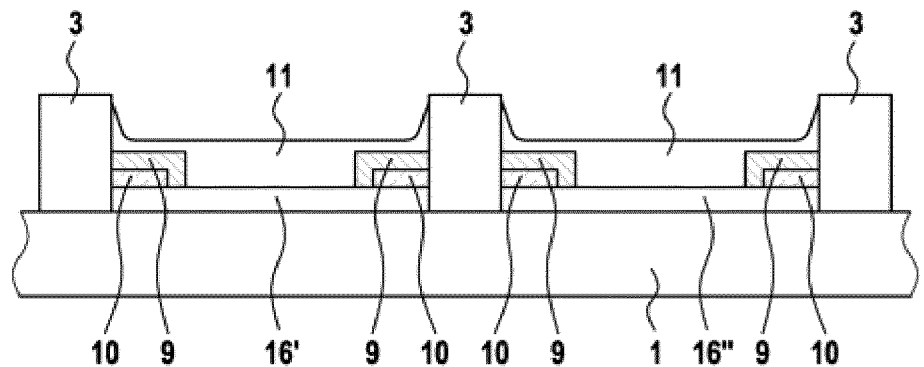
FIGS. 10a (cross section) and 10b (plane view) are schematic representations of one embodiment of the invention with two electrode segments laterally separated by two different blocks of insulating layer, all over sections of a transparent metal oxide layer. In this embodiment, the bank structures are located directly on the substrate and separate the transparent metal oxide layer sections.
Figure 10B:
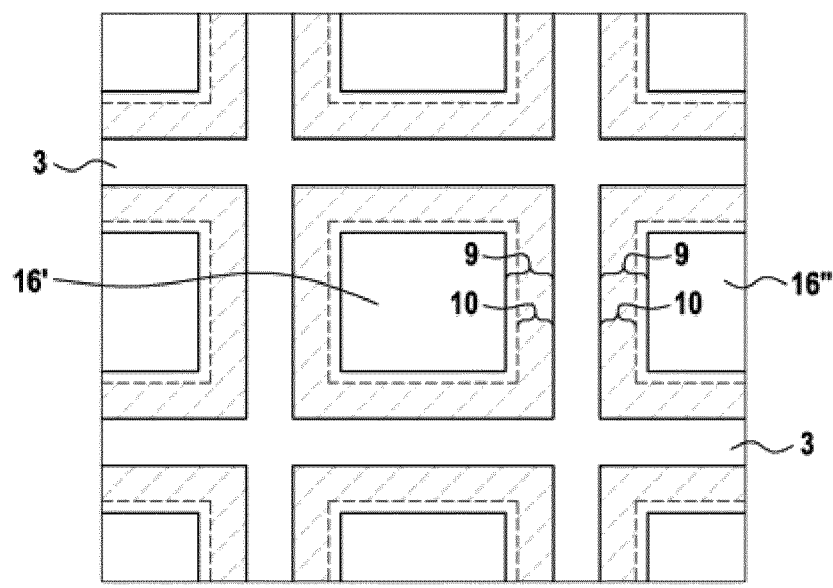
Figure 11A:
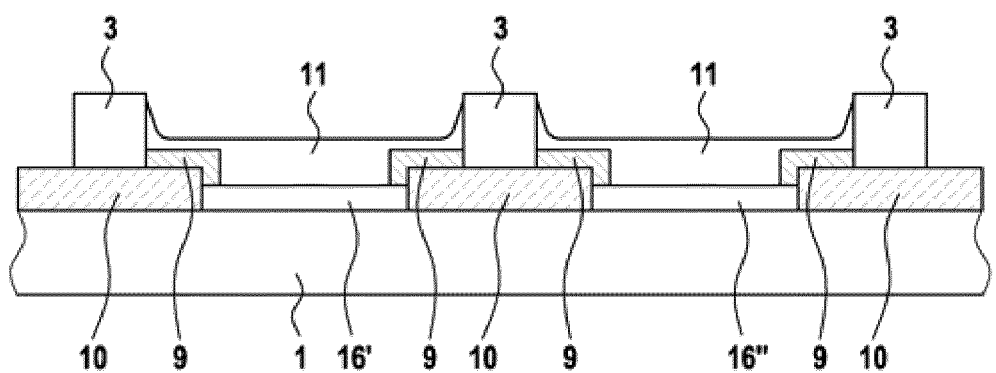
FIGS. 11a (cross section) and 11b (plane view) are schematic representations of one embodiment of the invention with two electrode segments laterally separated by two different blocks of insulating layer, all over sections of a transparent metal oxide layer. In this embodiment, the bank structures are located above an insulating layer which separates the transparent metal oxide layer segments.
Figure 11B:
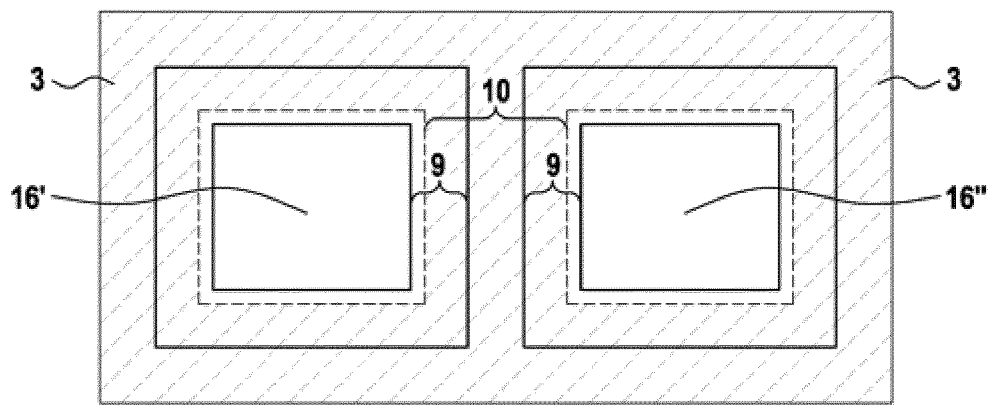

The transparent metal oxide layer may be subdivided into sections which are not in effective electrical contact with each other. The sections may be laterally separated by gaps, bank structures or insulating layers. Since each well area will have at least two metal electrode segments, each section of transparent metal oxide layer will be in contact with at least two metal electrode segments. The section of transparent metal oxide can correspond to a single well area in which case it should not be smaller in area than the well area as defined by the bank structures. In this case, if each section of the transparent metal oxide (corresponding to the well area) is individually controlled, there can be a common counter electrode across all cells and each well area will correspond to a single pixel. This is illustrated in FIGS. 10a (side view) and 10b (plane view). Note that in this particular case, the sections of transparent metal oxide layer 16' and 16" are shown as being separated by bank structures 3 which are located directly on the substrate. However, the transparent metal oxide layer could also be separated by an insulating layer on which the bank structure is subsequently located as shown in FIGS. 11a and 11b. Alternatively, the individual sections of the transparent metal layer could be larger than a single well area and extend across many well areas in a single direction. FIG. 12 (plane view) is that like as in FIGS. 11a and 11b except that the transparent metal oxide layer extends across multiple well areas in a single direction. By 'extend across multiple wells in a single direction', it is meant that the electrode section is a stripe that either underlies only one row of active areas in multiple adjacent well areas, so there are multiple parallel stripes within each well, or underlies only one row of multiple adjacent well areas, each with multiple active areas that share the same stripe. In FIG. 12, the bank structures 3 are on top of the insulating layer 10 when parallel to the direction of the transparent metal oxide strip but located over the transparent metal oxide section when perpendicular to the strip. Active areas 16, 16' and 16" each represent the exposed areas of the same single strip of the transparent metal oxide. To prevent the wetting effect, it is desirable to locate an insulating layer adjacent to the bank structures (and over the transparent metal oxide) that are perpendicular to the strip.

Figure 13:
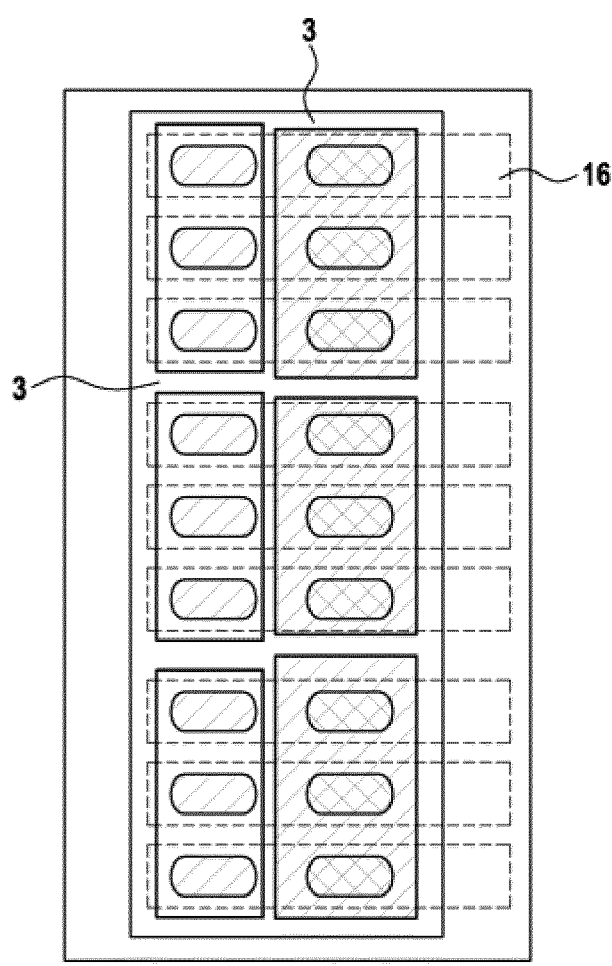
FIGS. 13 and 14 illustrate possible orientations of the well area relative to the long axis of the transparent metal oxide strip in the embodiment of FIG. 12.
Figure 14:
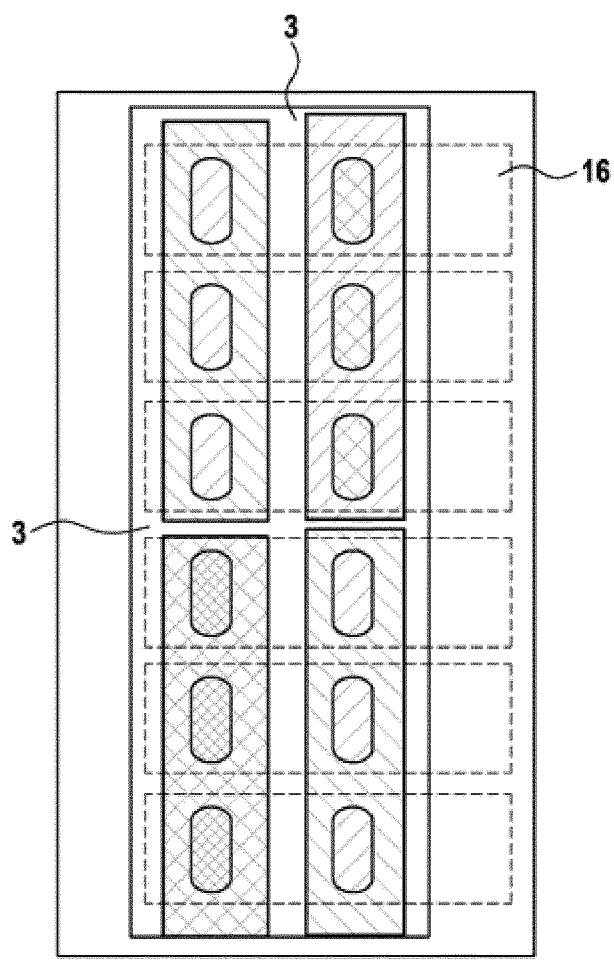

For those embodiments where the transparent metal oxide electrode sections are in the form of stripes that extend across multiple well areas, the well areas may be symmetrical in shape (for example, square or round) but also can be non-symmetrical in shape where the maximum length is different from the maximum width. Of these non-symmetrical shapes, rectangles, rectangles with rounded corners and ovals are preferred. For embodiments using non-symmetrical shaped well shapes, there are two possible orientations relative to the stripe of transparent metal oxide section and the bank structures. In one case (illustrated in FIG. 13), the long axis of the well area is perpendicular to the long axis of the bank structures. In another case (illustrated in FIG. 14), the long axis of the well area is parallel to the long axis of the bank structures.

At least two different electrode segments and a separating insulating layer are located within a well area defined by bank structures. Since the well area has a finite size, there will be a minimum of 3 bank structures with some minimum distance between any two banks (or opposing sections of the bank if the bank is non-linear). Since the well area is not limited to any particular shape, the banks do not necessarily have to be linear or parallel to each other. Desirably, a well area can be square or rectangular in shape where the side walls of the well are defined by four bank structures. However, polygonal, circular or oval well areas can be useful as well. It should be noted that 'square' or rectangular' includes shapes with rounded corners or even have slightly curved sides as well those with 90 degree corners and parallel sides.

The height (as measured from its base to its top, not including any underlying structures) of the bank structures should be the same or greater than the thickness of all of the organic active layers together and the insulating layer. Desirable heights of the bank structures are in the range of 500 to 5000 nm and most desirably 1000 to 2000 nm. In the case where the height of the bank structure is significantly greater than the thickness of the active layers and insulating layer, the top counter electrode may be located on top of the active layers and within the bank structures. Alternatively, material can be added to the active area to increase its thickness to be the same as the bank height if necessary. If the height of the bank structures is only slightly greater or the same as the thickness of the active layers and insulating layer, then the second conductive layer can be deposited uniformly over all of the active areas and bank tops if desired. The width of the bank structures should be in the range of 0.5 to 150 μm and most preferably, 5 to 50 μm.

The bank structures may be formed from polymeric materials and patterned by photolithography. The bank structures may be photoresist resins and prepared by positive or negative working methods. Alternatively, the bank structures may be made using non-photoresist polymers patterned using masks or patterned protective layers that are later removed along with the unwanted bank material. Solution processes such as inkjet or printing that can be used to create a pattern are also suitable. As noted previously, it is well known in the art that the wetting properties of the bank structures are important. There are many methods that have been described to provide the desired hydrophilicity/hydrophobicity in the bank structures. In addition, many methods for adjusting the physical shape of the bank structures to provide the appropriate fluid control during the deposition and drying. Any of these methods can be applied to the bank structures 3. Particularly desirable materials for the bank structures contain fluorine.

The suitable photoresist materials may include, for example, the combination of photosensitive resin, initiator, ethylenic alkaline soluble groups, ink repellent agent and crosslinking agent. The photosensitive rein could be either acrylic based, Novalak or Novalac, siloxane, epoxy based photoresist, fluorinated photoresist, (meth)acrylic based resists and silane compounds with or without fluoroalkyl groups. Suitable photoresists can be easily selected to maximize performance. It is desirable to add fluorine containing additives to the photoresist material.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means at least one polymer and one or more other materials added to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, surfactants, dyes, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

As defined herein, the terms "photoresist", "photoresist resin", "photoresist polymer", "photopatternable" and "photoresist process" are used interchangeably and refer to the materials and processes well known in the art of photolithography. Unless specifically defined, the materials and process can be positively or negatively working as well known in the art. It can also be water based (for example, poly(methyl acrylimidoglycolate methyl ether or poly (MAGME)). In the context of this invention, the nature of the materials and processes for photolithography to create the sections of the first conductive layer and the well-defining structures are, in general, not critical. It is well within the ability of one skilled in the art to design, select and test appropriate materials and processes to provide the desired structures.

A typical photolithography process involves the steps of cleaning and preparing the substrate, drying the substrate, spin-coating the photoresist resin along with any additives, softbake (typical conditions range from 65° C. for 120 s to 95° C. for 300 s, cooling down, radiation exposure (typical conditions range from 165 to 200 mJ/cm$^3$), post-exposure-bake (optional; typical conditions range from 2 to 120 min at 50 to 120° C. for this step when used), cool to room temperature, relaxation time, development, development, rinsing and dry spinning and a hard bake at 50 to 150° C. for 5 to 120 min.

Depending on the needs of the device and the materials of the active layer, the profile of the bank structures may be positive (broader at the bottom (closest to the substrate) and narrower at the top) or negative (narrower at the bottom and broader at the top). These profiles can be formed as a result of the photoresist process used to introduce the bank structures. Negative bank structures are preferred.

The formation of the charge transporting and other active layer(s) is accomplished by introducing the appropriate materials in a liquid form or as a solution in a solvent into the wells defined by the bank structures. It is important that the solution does not overflow or spill out of the well area. The method for applying the materials for the active layer(s) is not critical and may be carried out using a technique such as ink-jet, dispenser, nozzle coating, intaglio printing, letterpress printing or the like. Ink-jet methods are preferred. When the liquid containing the active material is applied with the dispenser, liquid discharge from the dispenser is preferably controlled by suck-back operation or the like at the beginning and the end of the application. When the materials are in liquid form without solvent, they can be solidified into the active layer by appropriate treatment. When the materials are in solution, the active layer is formed by removing the solvent by drying. The concentration of active material in the volume of solution delivered to the well area is sufficient to make a layer of desired thickness when the solvent is removed. Equipment, conditions and techniques for these processes are known to a person skilled in the art and are described in the literature.

Directly over the electrode segments and insulating layer(s) within the well area is a charge transporting layer. The thickness of the charge transporting layer is such that it completely covers both the electrode segments and insulating layer and completely fills the well area. That is, the thickness of the charge transporting layer is greater than the (thickness of the insulating layer–thickness of the electrode segment). The charge transporting layer may be composed of one or more layers; each layer may be composed of the same material or different materials. Each layer may be a single material or a mixture of materials. The charge transporting layer may be doped. In preferred embodiments, the charge transporting layer is not light emitting. However, in some embodiments, the charge transporting layer can be light emitting.

If the electrode segment is an anode, then the charge transporting layer is a hole transporting layer. In this case, the hole transporting layer may have two or more layers; for example, a hole-injecting layer (HIL) adjacent to the transparent anode with an overlying hole-transporting layer (HTL). This is a preferred embodiment of a hole-transporting layer. In the case of a HIL/HTL bilayer, the HIL may only overlay the transparent anode and not the insulating layer so long as the thickness of the HIL+HTL is greater than the (thickness of the insulating layer–thickness of the electrode segment). The materials for the hole-injecting or hole-transporting layer is not critical; they may be inorganic or organic as known in the art. Any known hole-injection or hole-transporting materials are suitable. Selection and use of appropriate materials are described in the literature and known to a person skilled in the art. Desirably, when the electronic device is an OLED and the electrode segment is an anode, it is a bottom-emitting OLED.

If the hole transporting layer covers the insulating layer by 50 nm or less, it is preferred to use materials with a conductivity of >8000 ohm/square. If the hole transporting layer covers the insulating layer by more than 50 nm, then it is preferred to use materials with a conductivity of <8000 ohm/square. This helps maintain low voltage across the device.

If the electrode segment is a cathode, then the charge transporting layer is an electron transporting layer. In this case, the electron transporting layer may have two or more layers; for example, an electron-injecting layer (EIL) adjacent to the cathode with an overlying electron-transporting layer (ETL). This is a preferred embodiment of an electron transporting layer. In the case of a EIL/ETL bilayer, the EIL may only overlay the transparent cathode and not the insulating layer so long as the thickness of the EIL+ETL is greater than the (thickness of the insulating layer–thickness of the electrode segment). The materials for the electron-injecting or electron-transporting layer is not critical; they may be inorganic or organic as known in the art. Any known electron-injection or electron-transporting materials are suitable. Selection and use of appropriate materials are described in the literature and known to a person skilled in the art. Desirably, when the electronic device is an OLED and the electrode segment is a cathode, it is a top-emitting OLED.

If the electron transporting layer covers the insulating layer by 50 nm or less, it is preferred to use materials with a conductivity of <8000 ohm/square. If the electron transporting layer covers the insulating layer by more than 50 nm, then it is preferred to use materials with a conductivity of >8000 ohm/square. This helps maintain low voltage across the device.

Over the charge transporting layer is one or more active layer(s) that completely fill the well area. Active layer(s) can be light-emitting or non-light emitting. They can be doped or undoped. Active layer(s) can include, for example, other charge transporting layers such as hole or electron-injecting or hole or electron-transporting layers, light emitting layers (including phosphorescent or fluorescent emitters) of any color, interlayers, color conversion layers, connector or charge-generation layers, metal layers, and inorganic layers.

The composition, thicknesses and design criteria (such as layer order) of the active layers are not critical and known to those skilled in the art. Over the active layer(s) is located a counter electrode. As known in the art, the device may be further encapsulated to protect it from water and oxygen. The device may also incorporate internal (within the encapsulation) or external (outside the encapsulation) light management or light extraction structures.

The invention will now be described in more detail by reference to the following examples, which are illustrative only and do not limit the scope of the invention. Above and below, unless stated otherwise percentages are percent by weight and temperatures are given in degrees Celsius (° C.).

Figure 15:
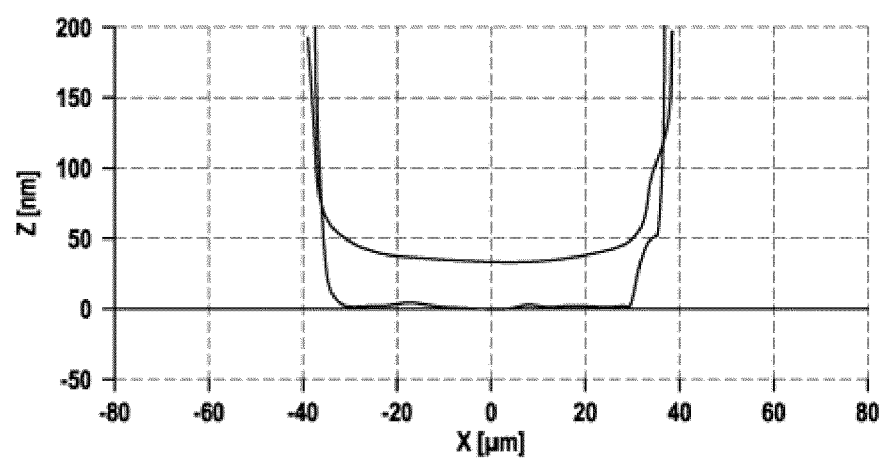
FIG. 15 illustrates the known wetting problem of inkjet printing on standard OLED substrate with wells formed from bank structures.

FIG. 15 illustrates the known problem of inkjet printing on standard OLED substrate with wells formed from bank structures. When a well is filled with inkjet solution of an organic material and the solvent removed, the residual organic layer is of uneven thickness. In particular, wetting effects cause the layer to be thicker in the area of the bank structures than in the middle of the cell.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features. All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

In the following examples, the substrate was glass; the ITO layer was 50 nm thick; the metal for the electrode segments was molybdenum that was 110 nm thick; the insulating layer was SiO$_2$ that was 50 nm thick; and the bank structures prepared from a Novolac photoresist with a Cytonic fluoro additive. The organic layer was prepared by filling the wells with a commercially available green ink solution and drying.

Example 1 (Prior Art)

Figure 16A:
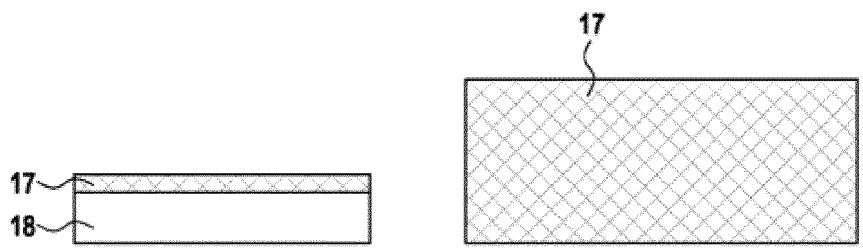
FIGS. 16a-16d show the sequence (side and plane views) for the preparation of a prior art device.
Figure 16B:
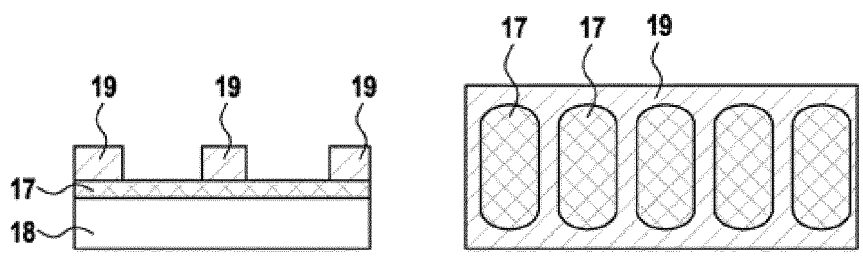
Figure 16C:
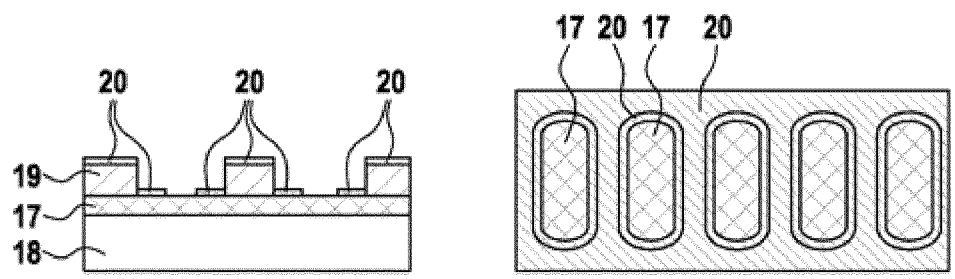
Figure 16D:
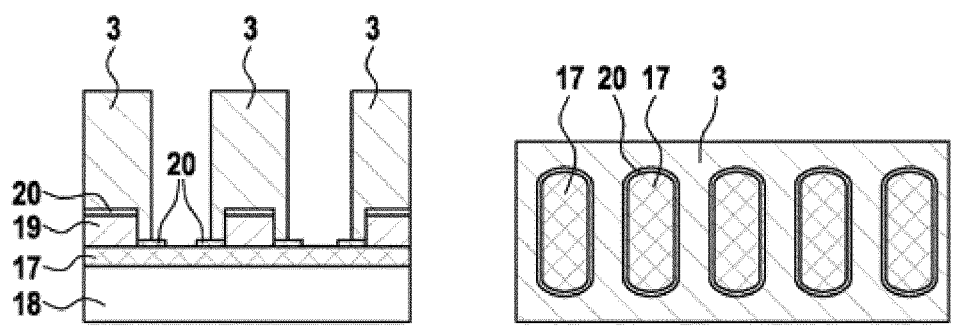
Figure 17A:
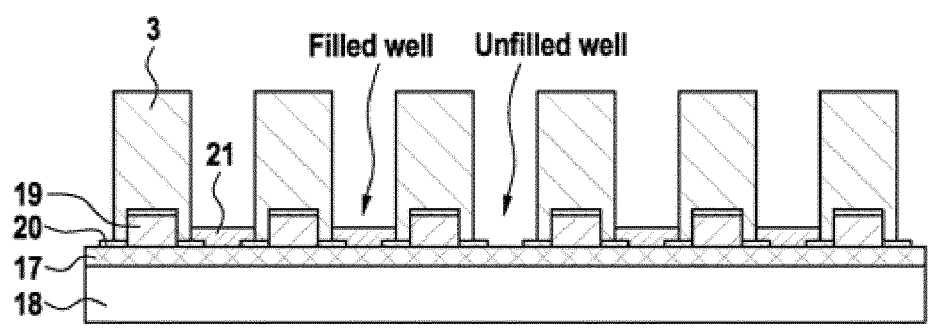
FIGS. 17a-17d show a prior art device with filled/unfilled well areas that demonstrates the problem.
Figure 17B:
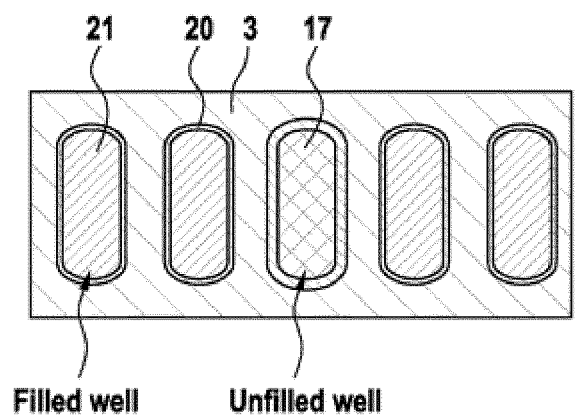
Figure 17C:
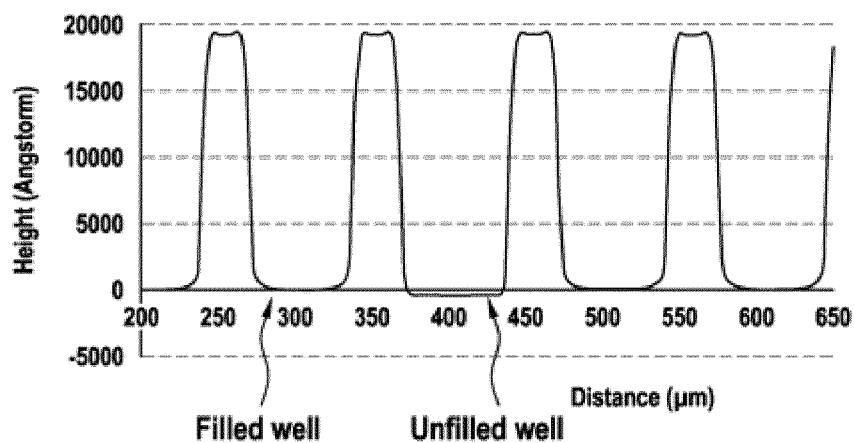
Figure 17D:
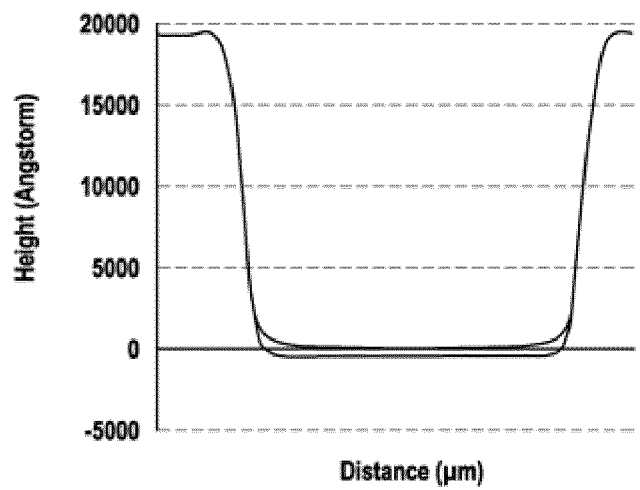

A prior art type of device was prepared according to the sequence shown in FIGS. 16a-d. On an ITO 17 covered substrate 18 (FIG. 16a) is deposited a pattern of metal electrode segments 19 (FIG. 16b). Then a pattern of an insulating layer 20 is deposited using masks so that the metal electrode segments 19 but only part of the ITO 17 are covered (FIG. 16c). Finally, bank structures 3 are deposited over the covered (by insulating layer 20) metal electrode, segments 19 but only part of the insulating layer 20 (which is over part of ITO 17) so that a well is created that has some exposed insulating layer 20 in the region next to the bank structure 3 along with exposed ITO 17 to serve as the electrode (FIG. 16d). FIGS. 17a and 17b shows plane and side views of Example 1 where only some of the wells are filled with active layer 21. FIG. 17c is a profile scan of the device shown in FIG. 17a-b. FIG. 17d compares the profile of one of the filled wells to the unfilled well. The thickness of the layer of organic material within the well is uneven.

Example 2 (Inventive)

Figure 18A:
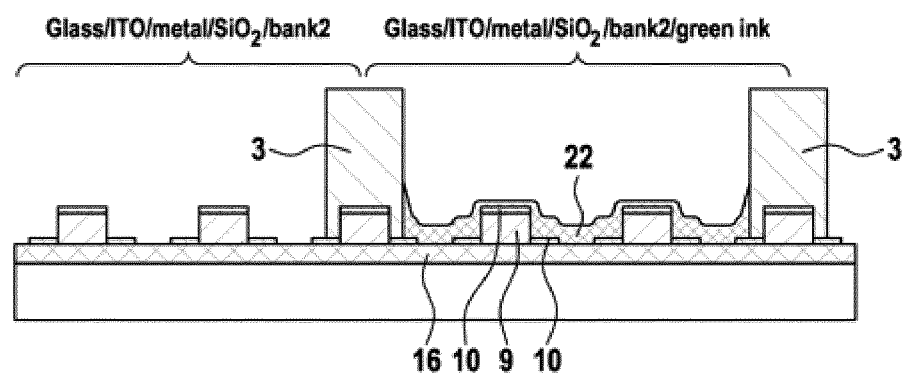
FIGS. 18a and 18b show an inventive device that demonstrates the improvement.
Figure 18B:
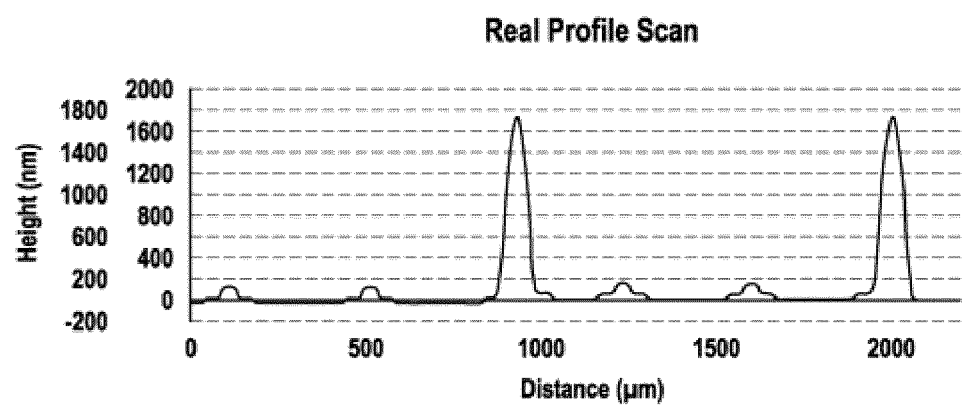

In the same manner as Example 1, an insulating layer 10/metal electrode segments 9/ITO 16/substrate 1 similar to FIG. 16c was prepared. However, as shown in FIG. 18a, the bank structures 3 are not located over each covered electrode segment (10/9) but rather spaced apart so that there are multiple electrode segments 9 between the bank structures 3. The left side of FIG. 18a, is a well which is not filled; the well on the right side is filled with an emissive green inkjet solution 22 and dried. FIG. 18b shows the profile scan of this device.

Note that the thickness of the active areas (where the electrode surface is exposed) is even.

Example 3 (Inventive)

Figure 19A:
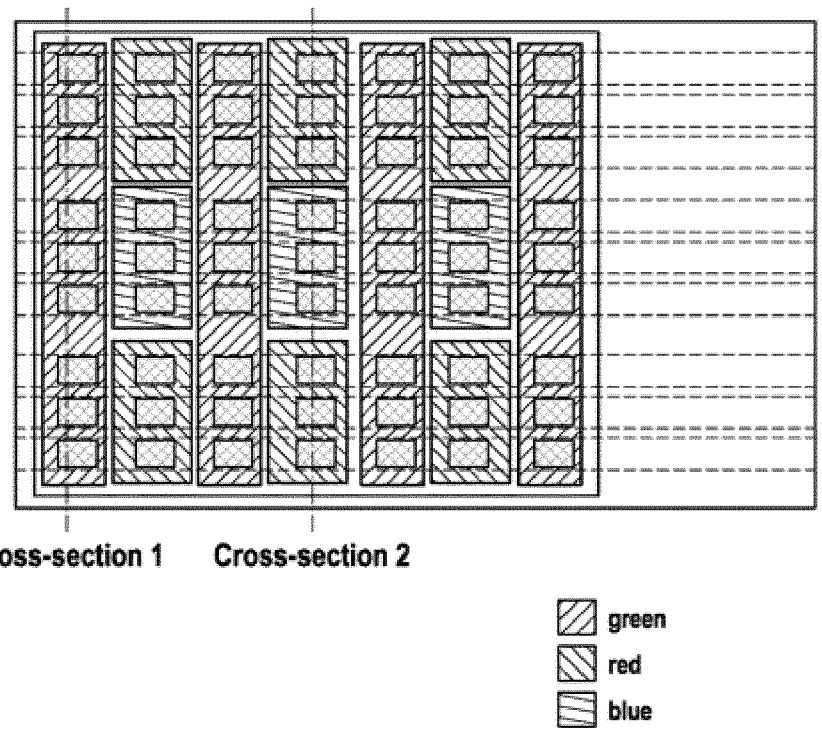
FIGS. 19a-c show one embodiment of an inventive device.
Figure 19B:
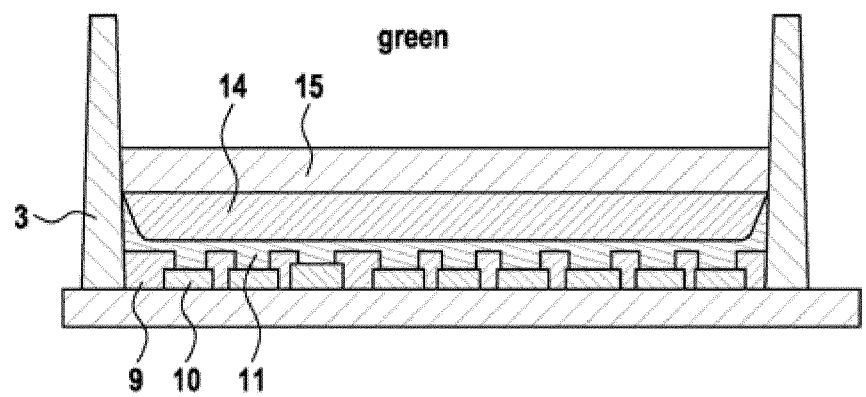
Figure 19C:
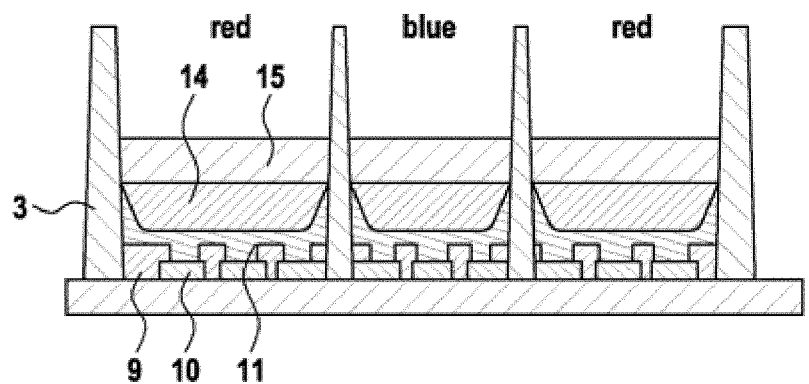

FIG. 19a shows a schematic diagram (not to scale) of a pixelated device where the electrode segments 10 are strips of ITO that extend across multiple wells. The electrode segments 10 are separated by insulating layers 9. Overlying both the electrode segments 10 and the insulating layers 9 and contained by bank structures 3 are active layer 11 along with counter electrode 14 and encapsulation 15. The device shown in FIG. 19a has a pentile layout; that is, there is a large vertically orientated well filled with green emissive materials adjacent to two smaller wells filled with red emissive materials which are separated by a well filled with blue emissive materials. Note that within each well, the emissive areas will be where the active layer 11 lies directly over and is in contact with the electrode segments 10. The areas where the active layer 11 is over the insulating layer 9 will be non-emissive. FIG. 19b shows the cross-section 1 of the device (large G emissive well) as indicated in FIG. 19a and FIG. 19c shows cross-section 2 (2 R and 1 B emissive wells). Note that there are different numbers of electrode segments within each well in cross-sections 1 and 2.

The invention claimed is:

1. An electronic device with multiple well areas located on a common substrate, wherein the substrate has at least one surface, where:
   each well area is defined by at least three bank structures located on the same surface of the common substrate, and that form the side walls of the well area;
   at least two electrode segments located in the well area, the electrode segments being separated laterally by at least one insulating bank and are located on the same surface of the common substrate where the insulating bank(s) are thicker than the electrode segments and wherein the number of electrode segments is greater than the number of insulating bank(s); and
   at least one charge transporting layer completely filling the well area in direct contact and completely overlying the whole surface of both the electrode segments and the insulating bank(s).

2. The electronic device according to claim 1 where overlying the charge transporting layer are one or more active layer(s) and a counter electrode.

3. The electronic device according to claim 2 which is an OLED.

4. The electronic device according to claim 2 where the electrode segment is an anode and the charge transporting layer is a hole transporting layer.

5. The electronic device according to claim 4 where the electrode segment is an anode and the charge transporting layer is a hole-injection layer adjacent to the anode and a hole-transporting layer over the hole-injection layer.

6. The electronic device according to claim 2 where the electrode segment is a transparent metal oxide.

7. The electronic device according to claim 2 where the electrode segment is metal.

8. The electronic device according to claim 7 where the top layer of the common substrate in direct contact with the metal electrode segments is a layer of transparent metal oxide so that together they form an electrode.

9. The electronic device according to claim 8 where the layer of transparent metal oxide on the common substrate is continuous under all metal electrode segments so that together they form a common electrode across the active area.

10. The electronic device according to claim 8 where the layer of transparent metal oxide on the common substrate is not continuous such that there are multiple metal electrode segments on each individual section of the transparent metal oxide; each section of transparent metal oxide with multiple metal electrode segments being electrically isolated from each other.

11. The electronic device according to claim 10 where each section of the electrically isolated transparent metal oxide with multiple metal electrode segments corresponds to an individual well area.

12. The electronic device according to claim 11 where the device is an OLED where each transparent metal oxide section is separately controlled and the counter electrode is common to all well areas so that the OLED is an active matrix device.

13. The electronic device according to claim 10 where each section of the electrically isolated transparent metal oxide with multiple metal electrode segments extend across multiple well areas in a single direction.

14. The electronic device according to claim 13 where the device is an OLED where each transparent metal oxide section is a stripe that extends across multiple well areas in a first direction and each counter electrode is a stripe that extends across multiple well areas in a second direction that is perpendicular to the first direction so that the OLED is a passive-matrix device.

15. The electronic device according to claim 13 where different well areas contain a different number of electrode segments.

16. The electronic device according to claim 2 where the electrode segment is a cathode and the charge transporting layer is an electron transporting layer.

17. The electronic device according to claim 2 where the electrode segment is a cathode and the charge transporting layer is an electron-injection layer adjacent to the cathode and an electron-transporting layer over the electron-injection layer.

18. The electronic device according to claim 1 where the insulating layer is inorganic.

19. The electronic device according to claim 18 where the insulating layer is selected from silicon oxide ($SiO_2$), silicon nitride ($Si_3N_4$) and silicon oxynitride (SiON) or mixtures thereof.

20. The electronic device according to claim 1 where the insulating layer is organic.

21. The electronic device according to claim 20 where the insulating layer is a photoresist resin.

22. The electronic device according to claim 1 where the bank structures are composed of a photoresist resin which contains fluorine or fluorine derivatives.

23. The electronic device according to claim 22 where the bank structures are located directly on the substrate and adjacent to an insulating layer on each side.

24. The electronic device according to claim 22 where the bank structures are located on top of an insulating layer.

25. The electronic device according to claim 1, wherein the side walls of the well area separate said charge transporting layer and said charge transporting layer does not overlie the top surface of the side walls.

26. A method for producing an electronic device with multiple well areas located on a common substrate, comprising the steps of:
   a. providing a pattern of electrode segments laterally separated by a thicker insulating layer;
   b. providing a pattern of bank structures to define well areas which contains at least two electrode segments separated by at least one insulating layer;
   c. providing a charge transporting layer in direct contact with and completely overlying the whole surface of both the electrode segments and the insulating layer that completely fills the well areas;
   d. providing active layer(s) over the charge transporting layer; and
   e. providing a counter electrode.

27. The method according to claim 26 where in step a, the pattern of electrode segments is created before the insulating layer is provided.

28. The method according to claim 26 where in step a, the pattern of insulating layers is created before the electrode segments are provided.

* * * * *